United States Patent
Butler et al.

Patent Number: 5,157,286
Date of Patent: Oct. 20, 1992

[54] CONDITIONAL CLOCKING OF THE SECOND LATCH OF A SHIFT REGISTER RATCH

[75] Inventors: Nicholas D. Butler, Romsey; Roy B. Harrison, Wellow, both of England

[73] Assignee: International Business Machines Corporation, Armonk, N.Y.

[21] Appl. No.: 484,144

[22] Filed: Feb. 23, 1990

[51] Int. Cl.$^5$ .................. H03K 19/00; H03K 5/13
[52] U.S. Cl. .................. 307/480; 307/269; 377/78; 377/81; 328/63; 328/72
[58] Field of Search ............ 377/78-81; 307/480, 269; 328/63, 72

[56] References Cited

U.S. PATENT DOCUMENTS

| | | | |
|---|---|---|---|
| 3,555,433 | 1/1971 | Croy | 377/81 |
| 4,627,085 | 12/1986 | Yuen | 307/480 |
| 4,961,013 | 10/1990 | Obermeyer et al. | 307/480 |

FOREIGN PATENT DOCUMENTS 0289159 2/1988 European Pat. Off.

OTHER PUBLICATIONS

IBM Technical Disclosure Bulletin, vol. 18, No. 11, Apr. 1976, pp. 3711-3712, N.Y., US; T. J. Blazejewski et al.: "Secondary path requiring only one additional connection".

IBM Technical Disclosure Bulletin, vol. 30, No. 3, Aug. 1987, pp. 1327-1330, Armonk, N.Y., US; "Reading L2 and gated B clock shift register latches using a bring-up tool to scan out the values while perserving machine state".

Proceedings International Test Conference 1984, 1984, pp. 338-347, IEEE, N.Y., US; H. H. Butt et al.: "Impact of mixed-mode self-test on life cycle cost of VLSI based designs".

*Primary Examiner*—Timothy P. Callahan
*Attorney, Agent, or Firm*—Martin J. McKinley

[57] ABSTRACT

A logic circuit is presented comprising a plurality of registers 30, 39; each register 30 having first register latches 31, 41 for clocking data into the register 30 in response to a first clock signal 37 and second register latches for clocking data out of the register in response to a second clock signal 38, and combinatorial logic comprising address logic 4 for addressing data to a register and first suppression logic 33 for inhibiting the first clock signal input to the register in response to the address logic, wherein the logic circuit further comprises second suppression logic 34, 35 for inhibiting the second clock signal input to the register in collective response to the address logic and the first clock signal.

8 Claims, 3 Drawing Sheets

CONDITIONAL CLOCKING OF THE SECOND LATCH OF A SHIFT REGISTER RATCH

TECHNICAL FIELD

The present invention relates to a logic circuit, more specifically, to logic circuit including a clocking arrangement for clocking data through multiple bit registers in the circuit.

BACKGROUND ART

Synchronous Complementary Metal Oxide Semiconductor (CMOS) logic circuits are commonly designed according to a Level Sensitive Scan Design (LSSD) technique. These LSSD circuits are responsive to a combination of a C clock signal and a B clock signal. The C clock signal and the B clock signal are non-overlapping. More specifically although they are of the same frequency it is a requirement of LSSD that active periods of the two clock signals do not coincide. A register in the logic circuit, designed according to an LSSD technique, consists of an array of Shift Register Latches (SRLs). An SRL consists of a first latch responsive to the C clock signal and a second latch responsive to the B clock signal. When the C clock signal is true, an input data bit is stored in the first latch. When the B clock signal is true, the input data bit is passed from the first latch and stored in the second latch. For the purpose of explanation, and to highlight aspects of the present invention, a process by which a latch responds to a clock signal by storing a data bit shall hereinafter be referred to as clocking.

Many synchronous logic circuits include a large number of multiple bit registers and may therefore contain thousands of SRLs. Power consumption problems can arise if such a logic circuit is manufactured by integrating CMOS devices on a silicon substrate. Logic gates consisting of CMOS devices consume most electrical power whilst in transience between logical states. This power is dissipated as heat. Therefore, the power consumed by many thousands of CMOS SRLs, switching on every clock cycle, makes a significant contribution to heat dissipated by a logic circuit. Such heat dissipation can restrict the choice of packaging material for encapsulating the logic circuit to those material with suitable heatsinking properties, which may not be the cheapest materials available. Therefore, since there is a demand for denser device integration and faster clock rates, to increase on-chip processing power, the need has arisen to examine methods for reducing power consumption associated with CMOS device technology.

Some synchronous logic circuits include registers for storing dependent data groups such as "set-up" parameters. Such data groups are modified infrequently during normal operation of the logic circuit. When such a data group changes, an address word, associated with the data group, can be generated by combinatorial logic in the logic circuit. The address word can be further decoded by the combinatorial logic to produce a true state in an I/0 address line which is otherwise held false. In a similar fashion, other I/0 address lines can be associated with other data groups stored in other registers in the synchronous logic circuit. In one such known synchronous logic circuit design, a separate suppression gate corresponds to every register storing a dependent data group. The suppression gate prevents the C clock signal from clocking the first latches of a register unless an associated I/0 address line is true. Such a function is referred to in the art as a gating function. This arrangement has the advantage that the use of C clock suppression can reduce the complexity of addressing logic and therefore the cost of combinatorial logic in the logic circuit. Furthermore, C clock suppression also provides some reduction in power consumed by the logic circuit. However, while the C clock signal to a particular register may be inhibited, because a corresponding I/0 address line is false, the B clock signal continues to clock the second latches in the register thereby causing unnecessary power consumption.

SUMMARY OF THE INVENTION

The aim of the present invention, therefore, is to provide a clock architecture for minimising the power consumed by a synchronous CMOS logic circuit.

According to the present invention there is now proposed a logic circuit comprising a plurality of registers; each register having first register latches for clocking data into the register in response to a first clock signal and second register latches for clocking data out of the register in response to a second clock signal, and combinatorial logic comprising address logic for addressing data to a register and first suppression logic for inhibiting the first clock signal input to the register in response to the address logic, wherein the logic circuit further comprises second suppression logic for inhibiting the second clock signal input to the register in collective response to the address logic and the first clock signal.

A logic circuit in accordance with the present invention has the advantage of providing a second gating function, applicable to the second clock signal yet responsive to the first clock signal, by which means data is now only admitted to any register when data stored therein is to change. The number of clock transitions undergone by second latches in the logic circuit can now be reduced. Since the first clock signal input to such a register may be subject to a first gating function, a mechanism is provided for further reducing power consumed by a CMOS logic circuit.

BRIEF DESCRIPTION OF THE DRAWING

A particular embodiment of the present invention, and aspects of logic circuitry to which the invention relates will now be described with reference to the following diagrams in which.

DESCRIPTION OF THE PREFERRED EMBODIMENTS

Figure 1:
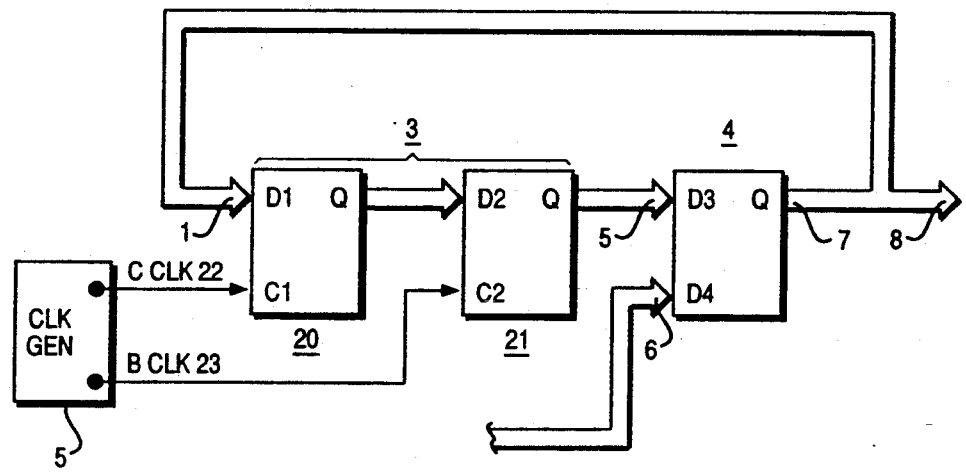
FIG. 1 is a block diagram of a general logic circuit having an LSSD architecture.

The present invention is broadly applicable to processing logic implemented by Very Large Scale Integration (VLSI) of (e.g. CMOS devices) on a silicon substrate. The general logic circuit shown in FIG. 1 is symbolic of such processing logic. Therefore, for background information, this general logic circuit, which may include an example of logic in accordance with the present invention, will now be described. The general logic circuit consists of a multiple bit register block 3 for data storage and a combinatorial logic network 4 for data processing. The multiple bit register block consists of separate registers for storing feedback data 1. The feedback data is passed through the multiple bit LSSD register block to the combinatorial logic in response to a non-overlapping clock stimulus 22,23 produced by a clock generator 5. As a result of such stimulus and additional input data 6, both the feedback data and data output 8 from the logic circuit can be refreshed.

An LSSD register structure arranged in accordance with the present invention will now be described with reference to FIG. 2. This register structure consists of separate registers for storing data groups associated with the logic circuit. For instance, register 30 is used to store data group A. Data bit a1 of data group A is stored in SRL latch 36. First latch 31 of SRL array 36 loads data bit a1 in response to a true state in the C clock signal 37 occurring during a period for which address line Ca is also true. AND gate 33 prevents the C clock signal from clocking the first latches in the register when address line Ca is false. The register also includes a control latch 34 into which the state of the address line Ca is loaded in response to a true state in the C clock signal. Second latch 32 of SRL array 36 loads data bit a1 in response to a true state in the B clock signal 38 occurring during a period for which delayed address line C'a is also true. The state of delayed address line C'a is specified by the contents of the control latch 34. AND gate 35 prevents the B clock signal from clocking the second latches in the register when delayed address line C'a is false. More specifically, during a true state in the B clock signal, the state of the delayed address line C'a is the same as that of the address line Ca during the immediately preceding true state of the C clock signal. A "look ahead" clock structure is therefore provided whereby the B clock signal only clocks the register in response to the C clock signal previously clocking the register which, in turn, is made possible by switching address line Ca to a true state.

Figure 2:
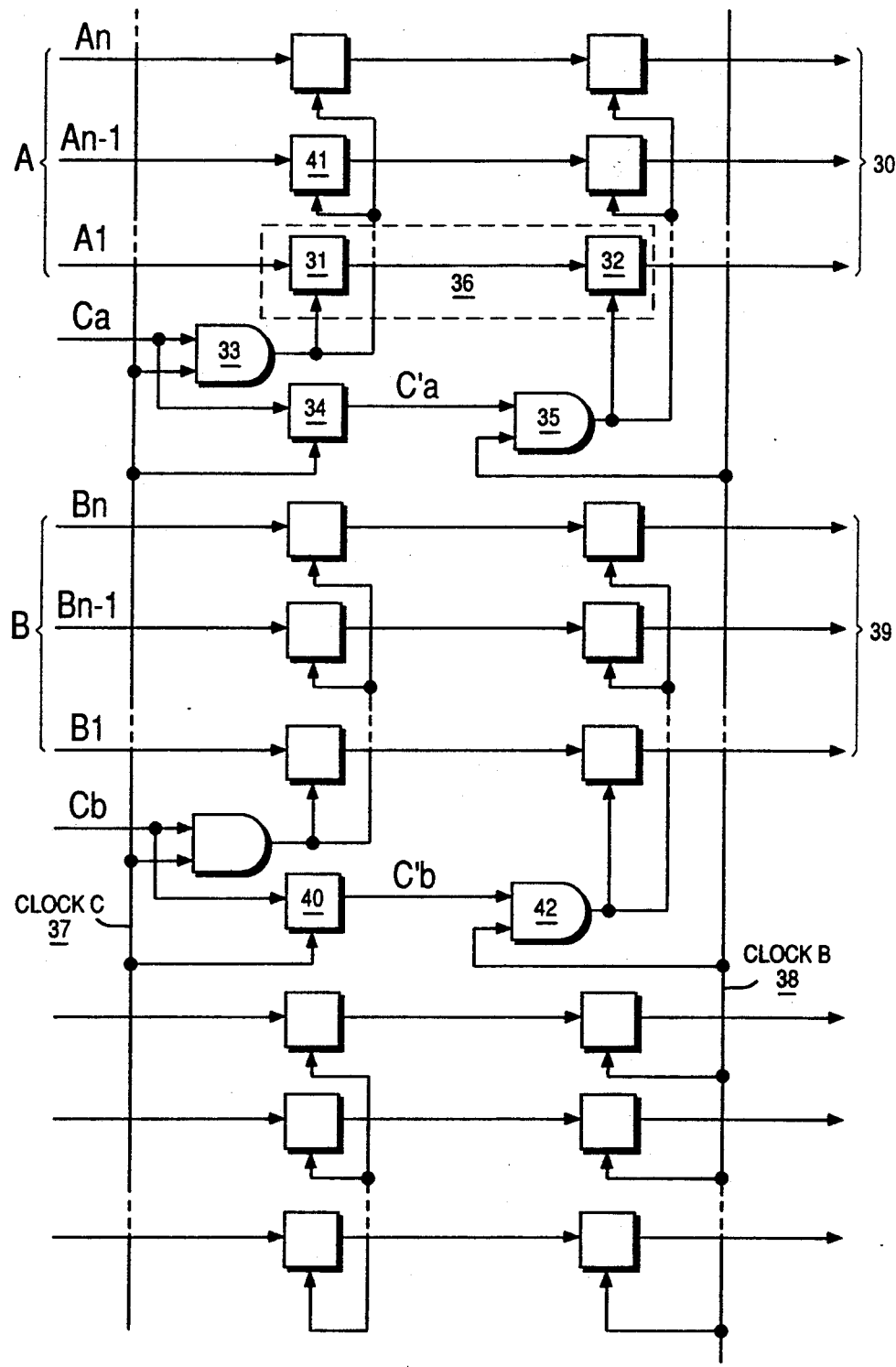
FIG. 2 is a block diagram of an LSSD register structure for the logic circuit.

Referring to FIG. 2, it can be seen that this "look ahead" clock structure can be implemented in as many registers in the logic circuit as necessary. For instance, in FIG. 2, another register 39 for storing data group B has a similar topology to register 30 for storing data group A. However, in the case of data group B, the C and B clock signals clock register 39 subject to the status of address line Cb. Therefore, by way of the present invention, such address lines can now select which registers the B clock signal is applied to, in addition to selecting which registers the C clock signal is applied to. It follows that this example of the "look ahead" clock structure can significantly reduce the number of clock transitions to which registers in the logic circuit are subjected. The degree of power reduction depends on the number of B clock cycles for which the address lines are true. If the address lines are true more often than they are false, the degree of power reduction will be accordingly small. It follows therefore, that the present invention is particularly applicable to those logic circuits comprising a large number of registers for storing "set-up" parameters which are changed infrequently during normal operation.

Figure 3:
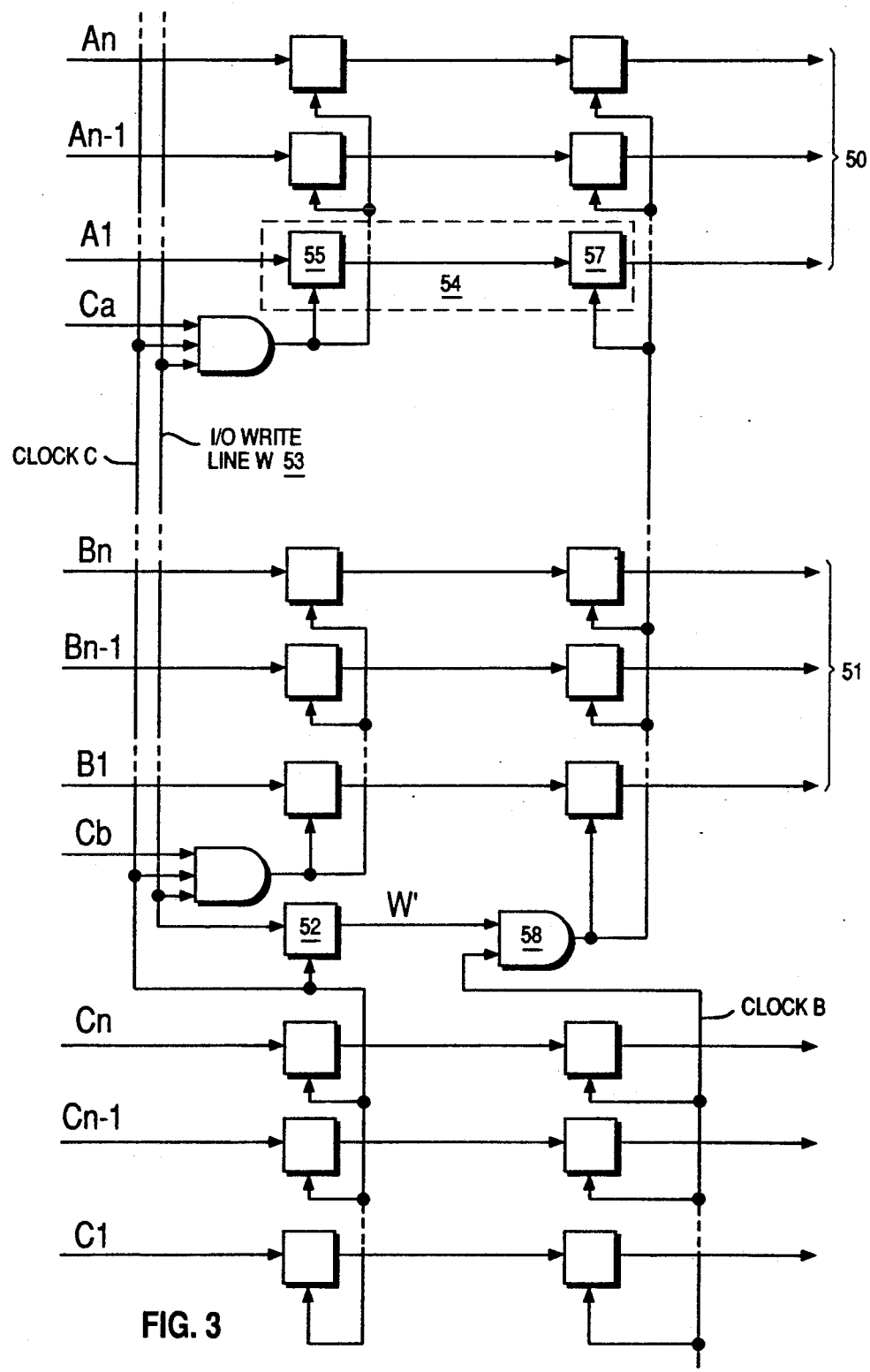
FIG. 3 is a block diagram of another LSSD register structure for the logic circuit.

By way of another example of the present invention, another LSSD register structure is shown in FIG. 3. This register structure has a similar "look ahead" clock function to that described in the preceding paragraphs. However in this case an alternative "look ahead" clock structure is employed. This alternative "look ahead" clock structure will now be described with reference to FIG. 3 in which register 50 is for storing the data group A as used in the description of the previous example. Data bit a1 is stored in SRL 54. First latch 55 of SRL 54 loads data bit a1 in response to a true state in the C clock signal occurring during a period for which both address line Ca and I/0 write line W 53 are true. AND gate 56 prevents the C clock signal from clocking the first latches in register 50 except when I/0 write line W and address line Ca are true simultaneously. Second latch 57 of SRL array 54 loads data bit a1 in response to a true state in the B clock signal occurring during a period for which delayed I/0 write line W' is also true. The state of delayed I/0 write line W' is specified by the contents of I/0 write latch 52 which loads the state of the I/0 write line W in response to a true state in the C clock signal. AND gate 58 prevents the B clock signal from clocking the second latches in register 50 when the delayed I/0 write bit W' is false. AND gate 58 and the I/0 write latch implement a "look ahead" clock function which can not only prevent the B clock signal from clocking register 50, but also from clocking register 51, which is for storing data group B, and into which data group B can be loaded in only when address line Cb is true during a true state in the C clock signal. In this structure a "look ahead" clock function can be implemented in as many registers in the logic circuit as necessary via the addition of a single control latch, a single AND gate, and a single additional I/0 write bit. By contrast, in the example of the present invention described in the preceding paragraphs, each register was assigned individual B clock suppression logic consisting of separate latch and AND gate. The example of the present invention described in this paragraph is therefore a less complicated implementation. The degree of power reduction provided by this structure depends on the number of B clock cycles for which the I/0 write bit is true. The I/0 write bit is true when signifying a change in data stored in the registers. If the I/0 write bit is true more often than it is false, the degree of power reduction will be accordingly small. However as stated in the preceding paragraphs, such circumstances are unlikely to arise in logic circuits having a large number of registers for storing "set-up" parameters which are changed infrequently during normal operation.

Figure 4:
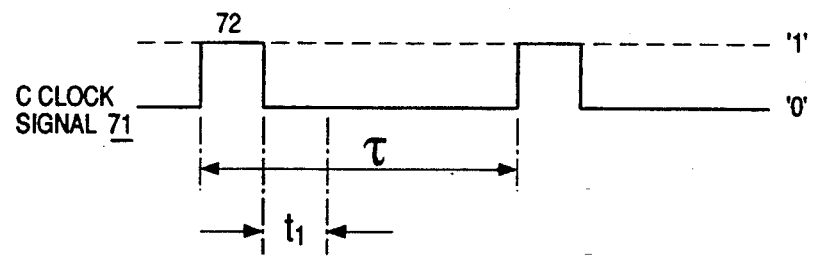
FIG. 4 illustrates a timing relationship between the C clock signal and the B clock signal associated with the LSSD architecture.
Figure 4:
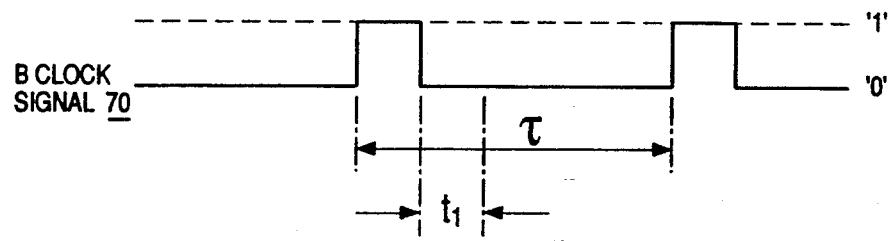

The clock signal timing diagram shown in FIG. 4 illustrates an example phase relationship between the C clock signal 71 and the B clock signal 70 for clocking the register structures shown in FIG. 2 and FIG. 3. Logic circuits produced by interconnecting CMOS devices contain parasitic impedances which give rise to signal delays. Such delays can cause spurious signals to propagate through the logic circuit. It is therefore necessary to define a "settling" interval t1 after each true state 72 of one clock signal during which the other clock signal is held false.

For the purpose of illustrating the present invention, the register structures described hereinbefore are composed of LSSD register latches; each latch being fabricated by the very large scale integration of CMOS devices. It will be appreciated, however, that the present invention is not limited in application to such logic circuits. Clearly, the present invention is applicable to any logic circuit in which data is processed in response to a set of non-overlapping clock signals and from which power is dissipated during periods of transience in such clock signals.

We claim:

1. A logic circuit for use with non-overlapping first and second clock signals and a first address signal, said logic circuit comprising in combination:

a first register comprising first and second register latches, each of said first and second register latches having a data input, a data output and a clock input, the output of said first register latch being coupled to the input of said second register latch;

a first logic gate having a first input for receiving said first address signal and a second input for receiving said first clock signal, the output of said first gate being coupled to the clock input of said first register latch, such that data at the input of said first register latch is clocked into said first register latch when both said first address signal and said first clock signal are active;

a first control latch having a data input, a data output and a clock input, said data input receiving said first address signal, and said clock input receiving said first clock signal, such that said first address signal is clocked into said first control latch when said first clock signal is active;

a second logic gate having a first input coupled to the output of said first control latch and a second input for receiving said second clock signal, the output of said second gate being coupled to the clock input of said second register latch, such that data at the input of said second register latch is clocked into said second register latch when both the output of said first control latch and said second clock signal are active.

2. The logic circuit of claim 1, further comprising:

a second register comprising third and fourth register latches, each of said third and fourth register latches having a data input, a data output and a clock input, the output of said third register latch being coupled to the input of said fourth register latch;

a third logic gate having a first input for receiving a second address signal and a second input for receiving said first clock signal, the output of said third gate being coupled to the clock input of said third register latch, such that data at the input of said third register latch is clocked into said third register latch when both said second address signal and said first clock signal are active;

a second control latch having a data input, a data output and a clock input, said data input receiving said second address signal, and said clock input receiving said first clock signal, such that said second address signal is clocked into said second control latch when said first clock signal is active;

a fourth logic gate having a first input coupled to the output of said second control register and a second input for receiving said second clock signal, the output of said fourth gate being coupled to the clock input of said fourth register latch, such that data at the input of said fourth register latch is clocked into said fourth register latch when both the output of said second control latch and said second clock signal are active.

3. The logic circuit of claim 2, further comprising:

a first combinational logic network coupled between the output of said second register latch and the input of said first register latch; and a second combinational logic network coupled between the output of said fourth register latch and the input of said third register latch.

4. The logic circuit of claim 1, further comprising a combinational logic network coupled between the output of said second register latch and the input of said first register latch.

5. A logic circuit for use with non-overlapping first and second clock signals, a first address signal and a control signal, said logic circuit comprising in combination:

a first register comprising first and second register latches, each of said first and second register latches having a data input, a data output and a clock input, the output of said first register latch being coupled to the input of said second register latch;

a first logic gate having a first input for receiving said first address signal, a second input for receiving said first clock signal and a third input for receiving said control signal, the output of said first gate being coupled to the clock input of said first register latch, such that data at the input of said first register latch is clocked into said first register latch when all of said first address signal, said first clock signal and said control signal are active;

a first control latch having a data input, a data output and a clock input, said data input receiving said first control signal, and said clock input receiving said first clock signal, such that said control signal is clocked into said first control latch when said first clock signal is active;

a second logic gate having a first input coupled to the output of said first control latch and a second input for receiving said second clock signal, the output of said second gate being coupled to the clock input of said second register latch, such that data at the input of said second register latch is clocked into said second register latch when both the output of said first control latch and said second clock signal are active.

6. The logic circuit of claim 5, further comprising:

a second register comprising third and fourth register latches, each of said third and fourth register latches having a data input, a data output and a clock input, the output of said third register latch being coupled to the input of said fourth register latch, the clock input of said second register latch being coupled to the output of said second logic gate;

a third logic gate having a first input for receiving a second address signal, a second input for receiving said first clock signal and a third input for receiving said control signal, the output of said third gate being coupled to the clock input of said third register latch, such that data at the input of said third register latch is clocked into said third register latch when all of said second address signal, said first clock signal and said control signal are active;

7. The logic circuit of claim 6, further comprising:

a first combinational logic network coupled between the output of said second register latch and the input of said first register latch; and a second combinational logic network coupled between the output of said fourth register latch and the input of said third register latch.

8. The logic circuit of claim 5, further comprising a combinational logic network coupled between the output of said second register latch and the input of said first register latch.

* * * * *